United States Patent
Bhattacharyya et al.

Patent Number: 6,134,139
Date of Patent: Oct. 17, 2000

[54] MAGNETIC MEMORY STRUCTURE WITH IMPROVED HALF-SELECT MARGIN

[75] Inventors: Manoj K. Bhattacharyya, Cupertino; James A. Brug, Menlo Park, both of Calif.

[73] Assignee: Hewlett-Packard, Palo Alto, Calif.

[21] Appl. No.: 09/363,081

[22] Filed: Jul. 28, 1999

[51] Int. Cl.[7] .................................................. G11C 11/14
[52] U.S. Cl. .............................. 365/171; 365/55; 365/66
[58] Field of Search .................................. 365/171, 173, 365/48, 55, 66, 74, 243.5, 52

[56] References Cited

U.S. PATENT DOCUMENTS

| | | | |
|---|---|---|---|
| 3,577,134 | 5/1971 | Bergman | 340/174 |
| 4,887,236 | 12/1989 | Schloemann | 365/173 |
| 5,155,642 | 10/1992 | Voegeli | 360/113 |
| 5,587,943 | 12/1996 | Torok et al. | 365/158 |
| 5,605,733 | 2/1997 | Ishikawa et al. | 428/65.3 |
| 5,640,343 | 6/1997 | Gallagher et al. | 365/171 |
| 5,793,697 | 8/1998 | Scheuerlein | 365/230.07 |

*Primary Examiner*—David Nelms
*Assistant Examiner*—Thong Le

[57] ABSTRACT

A magnetic memory with enhanced half-select margin includes an array of magnetic memory cells each having a data storage layer with an easy axis and an array of conductors each having an angle of orientation with respect to the easy axes that is preselected to enhance half-select margin in the magnetic memory. The angle of orientation is such that the longitudinal write field is enhanced and the perpendicular write field is minimized in a selected memory cell. The magnetic memory cells optionally includes a structured data storage layer including a control layer that minimizes the likelihood of half-select switching in the unselected magnetic memory cells.

23 Claims, 3 Drawing Sheets

MAGNETIC MEMORY STRUCTURE WITH IMPROVED HALF-SELECT MARGIN

BACKGROUND OF THE INVENTION

1. Field of Invention

The present invention pertains to the field of magnetic memories. More particularly, this invention relates to a magnetic memory structure that yields improved half-select margins.

2. Art Background

A magnetic memory such as a magnetic random access memory (MRAM) typically includes an array of magnetic memory cells. A typical magnetic memory cell includes a layer of magnetic film in which magnetization is alterable and a layer of magnetic film in which magnetization is fixed or "pinned" in a particular direction. The magnetic film having alterable magnetization may be referred to as a data storage layer and the magnetic film which is pinned may be referred to as a reference layer.

Typically, the logic state of a magnetic memory cell is indicated by its resistance which depends on the relative orientations of magnetization in its data storage and reference layers. A magnetic memory cell is typically in a low resistance state if the orientation of magnetization in its data storage layer is substantially parallel to the orientation of magnetization in its reference layer. A magnetic memory cell is typically in a high resistance state if the orientation of magnetization in its data storage layer is substantially anti-parallel to the orientation of magnetization in its reference layer.

A magnetic memory cell is usually written to a desired logic state by applying external magnetic fields that rotate the orientation of magnetization in its data storage layer. Typically, the orientation of magnetization in the data storage layer aligns along an axis of the data storage layer that is commonly referred to as its easy axis. Typically, the external magnetic fields are applied to flip the orientation of magnetization in the data storage layer along its easy axis to either a parallel or anti-parallel orientation with respect to the orientation of magnetization in the reference layer depending on the desired logic state.

Prior magnetic memories usually include an array of word lines and bit lines which are used to apply external magnetic fields to the magnetic memory cells during writing. The magnetic memory cells are usually located at intersections of the word lines and bit lines.

A selected magnetic memory cell is usually written by applying electrical currents to the particular word and bit lines that intersect at the selected magnetic memory cell. Typically, an electrical current applied to the particular bit line generates a magnetic field substantially aligned along the easy axis of the selected magnetic memory cell. The magnetic field aligned to the easy axis may be referred to as a longitudinal write field. An electrical current applied to the particular word line usually generates a magnetic field substantially perpendicular to the easy axis of the selected magnetic memory cell.

Typically, only the selected magnetic memory cell receives both the longitudinal and the perpendicular write fields. Other magnetic memory cells coupled to the particular word line usually receive only the perpendicular write field. Other magnetic memory cells coupled to the particular bit line usually receive only the longitudinal write field.

The magnitudes of the longitudinal and the perpendicular write fields are usually chosen to be high enough so that the selected magnetic memory cell switches its logic state but low enough so that the other magnetic memory cells which are subject to either the longitudinal or the perpendicular write field do not switch. An undesirable switching of a magnetic memory cell that receives only the longitudinal or the perpendicular write field is commonly referred to as half-select switching.

Manufacturing variation among the magnetic memory cells typically increases the likelihood of half-select switching. For example, manufacturing variation in the longitudinal or perpendicular dimensions or shapes of the magnetic memory cells may increase the likelihood of half-select switching. In addition, variation in the thicknesses or the crystalline anisotropy of data storage layers may increase the likelihood of half-select switching. Unfortunately, such manufacturing variation decreases the yield in manufacturing processes for magnetic memories and reduces the reliability of prior magnetic memories.

SUMMARY OF THE INVENTION

A magnetic memory with improved half-select margin is disclosed. The magnetic memory includes an array of magnetic memory cells each having a data storage layer with an easy axis and an array of conductors each having an angle of orientation with respect to the easy axes that is preselected to enhance half-select margin in the magnetic memory. The angle of orientation is such that the longitudinal write field is enhanced and the perpendicular write field is minimized in a selected memory cell. The magnetic memory cells optionally includes a structured data storage layer including a control layer that minimizes the likelihood of half-select switching in the unselected magnetic memory cells.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
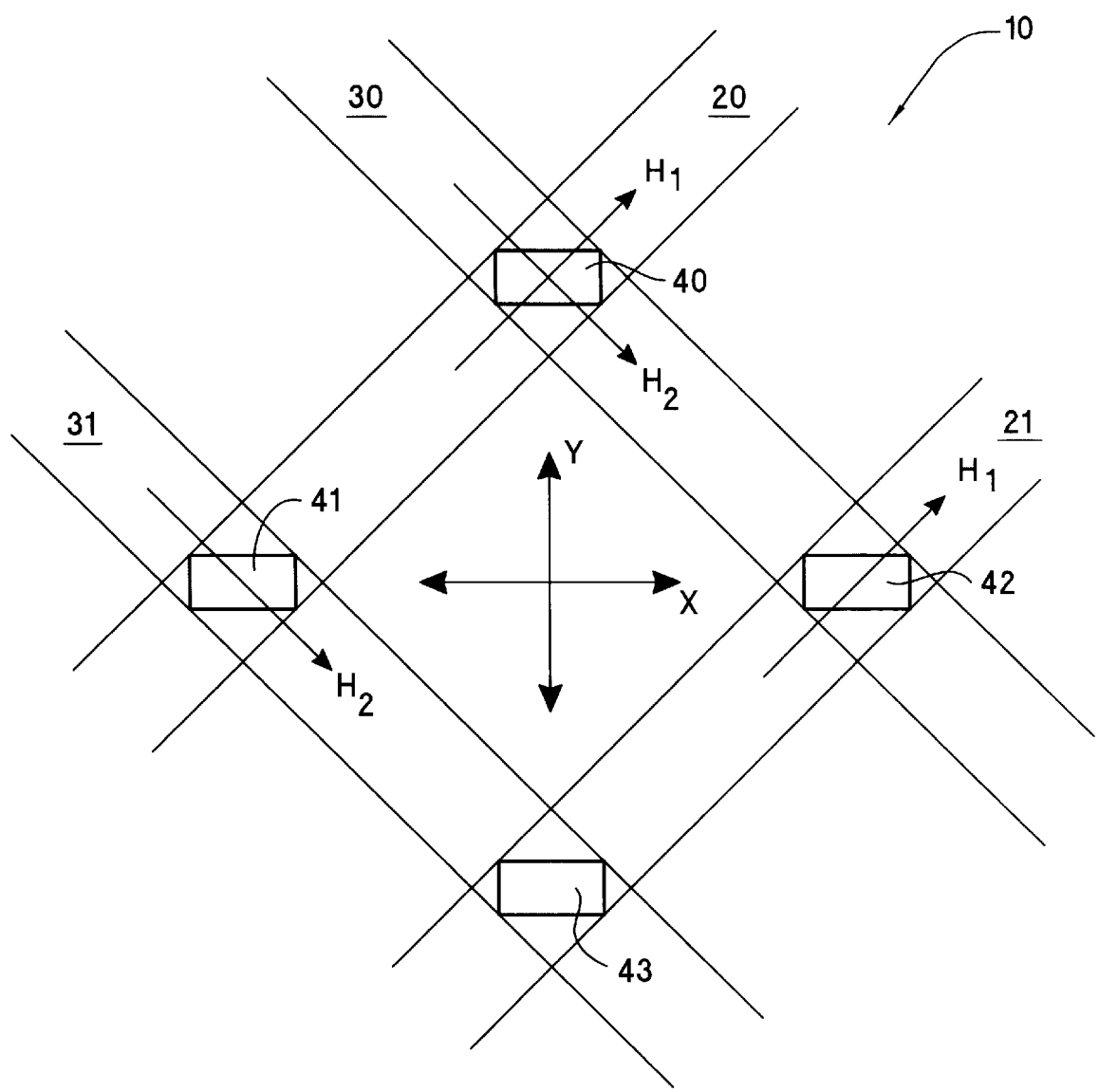
FIG. 1 is a top view of a magnetic memory according to the present techniques.

FIG. 1 is a top view of a magnetic memory 10 according to the present techniques. The magnetic memory 10 includes an array of magnetic memory cells 41–43. The magnetic memory 10 also includes an array of conductors 20–21 and 30–31 that enable read and write access to the magnetic memory cells 40–43. In one embodiment, the conductors 30–31 are top conductors that define rows of the magnetic memory 10 and the conductors 20–21 are bottom conductors that define columns of the magnetic memory 10.

In one embodiment, the magnetic memory cells 40–43 each include a magnetic film which functions as a data storage layer, a magnetic film which functions as a reference layer, and a tunnel barrier between the data storage layer and the reference layer. This structure of a magnetic memory cell may be referred to as a spin tunneling device in that electrical charge migrates through the tunnel barrier during read operations. This electrical charge migration through the tunnel barrier is due to a phenomenon known as spin tunneling and occurs when a read voltage is applied to a magnetic memory cell. In an alternative embodiment, a giant magneto-resistive (GMR) structure may be used in the magnetic memory cells 40–43.

Also shown is a set of x-y axes that will be used to describe the relative orientations of the conductors 20–21 and 30–31 to the magnetic memory cells 40–43 and the relative orientations of magnetic fields applied to the magnetic memory cells 40–43 during write operations. The x axis is substantially parallel to the easy axes of the data storage layers of the magnetic memory cells 40–43 and is also referred to as the longitudinal direction. The y axis is substantially perpendicular to the easy axes of the data storage layers of the magnetic memory cells 40–43 and is also referred to as the perpendicular direction.

The magnetic memory cells 40–43 are formed so that they have an easy axis which is substantially parallel to the x axis. The conductors 30–31 are formed so that they are substantially orthogonal to the conductors 20–21. In addition, the conductors 20–21 and the conductors 30–31 are each formed so that they have a preselected angle of orientation with respect to the easy axes of the magnetic memory cells 40–43 which are substantially along the x axis. These geometries may be formed using known magnetic film process techniques including photolithography, masking, and etching.

The logic states of the magnetic memory cells 40–43 are manipulated by applying electrical currents to the conductors 20–21 and 30–32. For example, the magnetic memory cell 40 is written by applying electrical currents to the conductors 20 and 30 that intersect at the magnetic memory cell 40. The electrical current applied to the conductor 30 in one direction causes a magnetic field ($H_1$) in the magnetic memory cell 40 according to the right-hand rule. This electrical current in the conductor 30 also causes an $H_1$ field in the magnetic memory cell 42. Similarly, the electrical current applied to the conductor 20 in one direction causes a magnetic field ($H_2$) in the magnetic memory cells 40 and 41 according to the right-hand rule.

The preselected angle of orientation of the conductors 20–21 and 30–31 with respect to the easy axes of the data storage layers in the magnetic memory cell 40–43 is such that the perpendicular components of $H_1$ and $H_2$ cancel each other out in the magnetic memory cell 40 and the longitudinal components of $H_1$ and $H_2$ combine along the easy axis in the magnetic memory cell 40. This preselected angle of orientation of the conductors 20–21 and 30–31 is also such that the $H_1$ and $H_2$ fields in the magnetic memory cells 42 and 41, respectively, are well below the strength needed to rotate the data storage layers of the magnetic memory cells 42 and 41. In one embodiment, the preselected angle of orientation of the conductors 20–21 and 30–31 with respect to the easy axis of the data storage layers in the magnetic memory cell 40–43 is a substantial 45 degree angle with respect to the x or the y axis.

Figure 2:
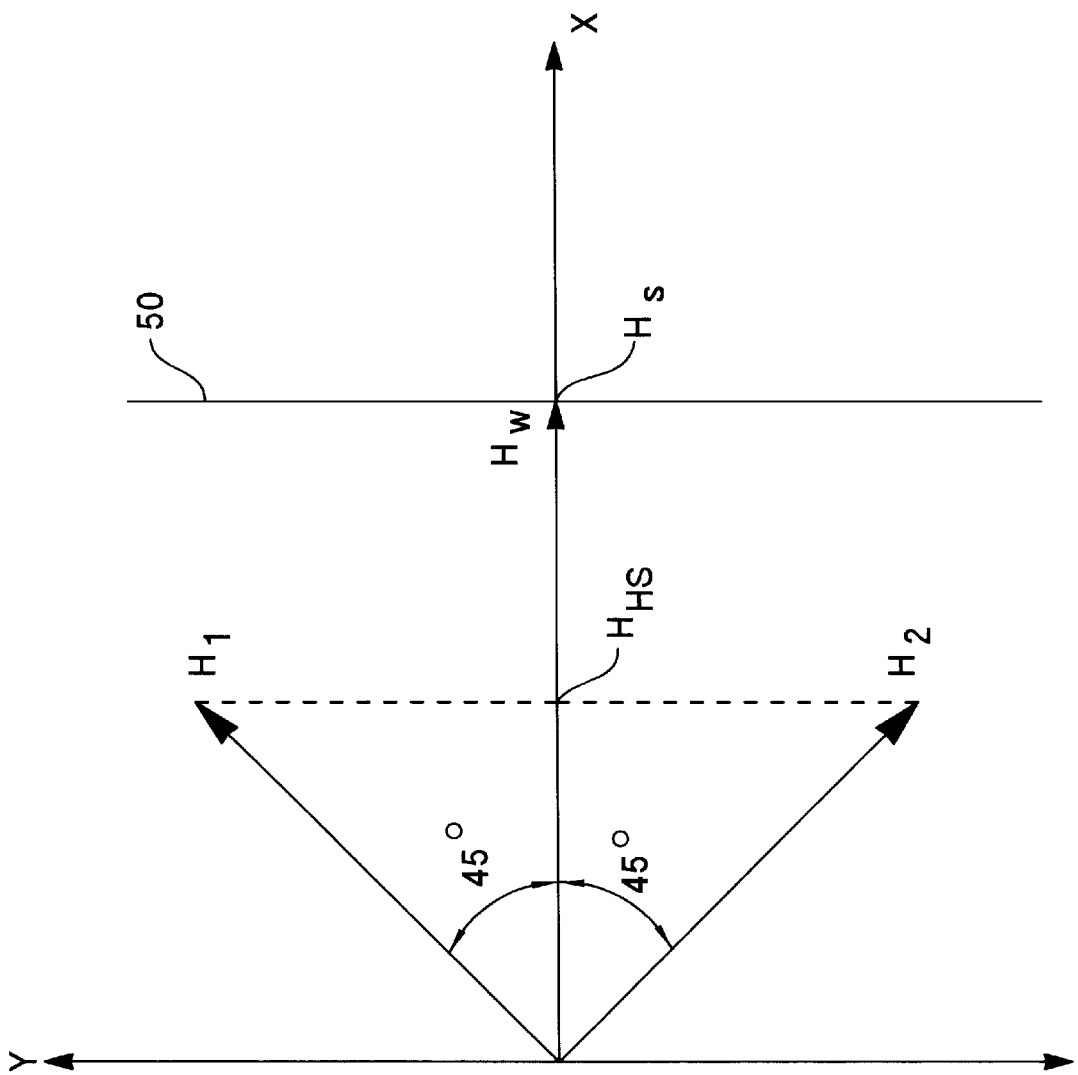
FIG. 2 shows the relationship between the angled $H_1$ and $H_2$ fields and the switching characteristics of the data storage layer of a magnetic memory cell.

FIG. 2 shows the relationship between the $H_1$ and $H_2$ fields and the switching characteristics of the data storage layer of the magnetic memory cell 40. In this embodiment, the preselected angle of orientation of the conductors 20 and 30 with respect to the easy axis of the data storage layer in the magnetic memory cell 40 is substantially equal to 45 degrees. Thus, the vector $H_1$ forms a 45 degree angle with respect to the x axis. Similarly, the vector $H_1$ forms a 45 degree angle with respect to the x axis. A vector $H_W$ represents a vector which results from a combination of the $H_1$ and $H_2$ vectors.

A line 50 represents a theoretical switching characteristic for the data storage layer of the magnetic memory cell 40. The line 50 shows that a magnetic field having a minimum magnitude equal to Hs is needed to flip the orientation of magnetization in the data storage layer of the magnetic memory cell 40 between the −x and the +x directions.

The magnitudes of the $H_1$ and $H_2$ fields are preselected so that the resulting field $H_W$ has a magnitude that is greater than or equal to the magnitude $H_S$ needed to write the magnetic memory cell 40. For example, if the $H_1$ and $H_2$ fields are such that the field $H_W$ has a magnitude equal to the magnitude $H_S$, then the $H_1$ and $H_2$ fields each have an x component with a magnitude $H_{HS}$ equal to $H_S/2$. This means that the magnetic memory cells 41 and 42 are each subject to a writing field equal to $H_S/2$ in their longitudinal directions during a write operation to the magnetic memory cell 40. This is equivalent to a 100 percent half select margin. It may be preferable that the magnitudes of the $H_1$ and $H_2$ fields be slightly larger than that necessary to yield the $H_W$ field in order to provide a write margin.

In practice, the switching characteristic represented by the line 50 varies among the magnetic memory cells 40–43 due to manufacturing variation. In addition, the switching characteristic may be such that lower magnitudes of the x component of the $H_1$ or $H_2$ fields can cause switching in the magnetic memory cells 41 and 42 in the presence of a perpendicular field. In other words, the line 50 may curve back toward the y axis at points that are farther away from the x axis. This may be due to a variety of factors. For example, there may be manufacturing variation in the crystalline anisotropy value (Hk) of the data storage layers of the magnetic memory cells 40–43. In addition, there may be variations in the thickness of the data storage layers or in the shape of the data storage layers of the magnetic memory cells 40–43. For example, photolithography process steps may produce varying rounded edges rather than rectangular edges of the data storage layers. Moreover, data storage layers having square rather than rectangular shapes may have significantly different switching characteristics.

Figure 3:
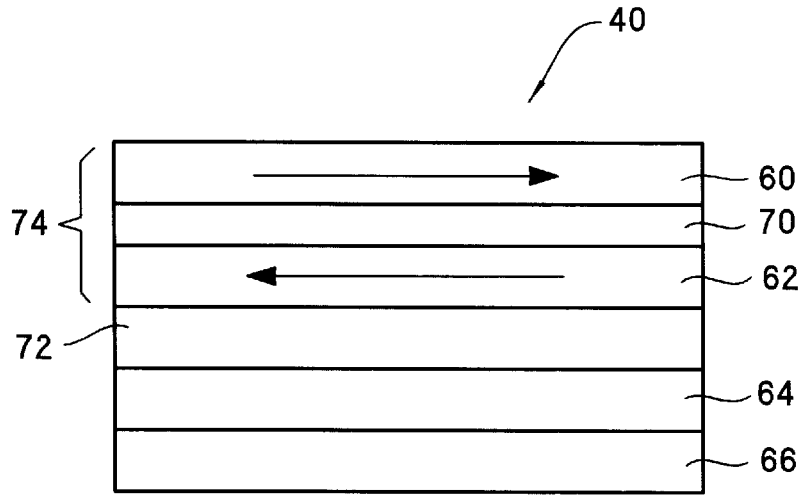
FIG. 3 shows a structure for a magnetic memory cell which provides additional half-select margin during write operations.

FIG. 3 shows a structure for the magnetic memory cell 40 which provides additional half-select margin during write operations. The magnetic memory cell 40 includes a reference layer 64, a tunnel barrier 72 of dielectric material, and a data layer structure 74.

The reference layer 64 is a layer of magnetic film in which magnetization is pinned by a pinning layer 66. The pinning layer 66 may be a layer of antiferromagnetic material such as iron-manganese (FeMn) or nickel-manganese (NiMn).

The data layer structure 74 includes a data layer 62 and a control layer 60. The data layer 62 functions as a data storage layer that switches its orientation of magnetization around its easy axis in response to applied write fields. The data layer 62 and the control layer 60 are separated by a decoupling layer 70.

The control layer 60 is formed with a relatively low crystalline anisotropy value with respect to the crystalline anisotropy value of the data layer 62. For example, the control layer 60 may have a crystalline anisotropy value of 5 oe and the data layer 62 may have a crystalline anisotropy value of 30–40 oe.

The decoupling layer 70 is formed from material such as copper or tantalum, etc., and decouples the magnetic fields in the data layer 62 and the control layer 60. The absence of exchange coupling enables the magnetic fields in the data layer 62 and the control layer 60 to rotate relatively freely with respect to one another. However, in steady state after switching has occurred in the data layer 62, the orientation of magnetization in the data layer 62 is opposite to the orientation of magnetization in the control layer 60 as shown by the arrows. This is due to magnetostatic coupling between the data layer 62 and the control layer 60. The opposing field in the control layer 60 acts to resist or dampen switching in the presence of a magnetic field in the perpendicular direction.

Figure 4:
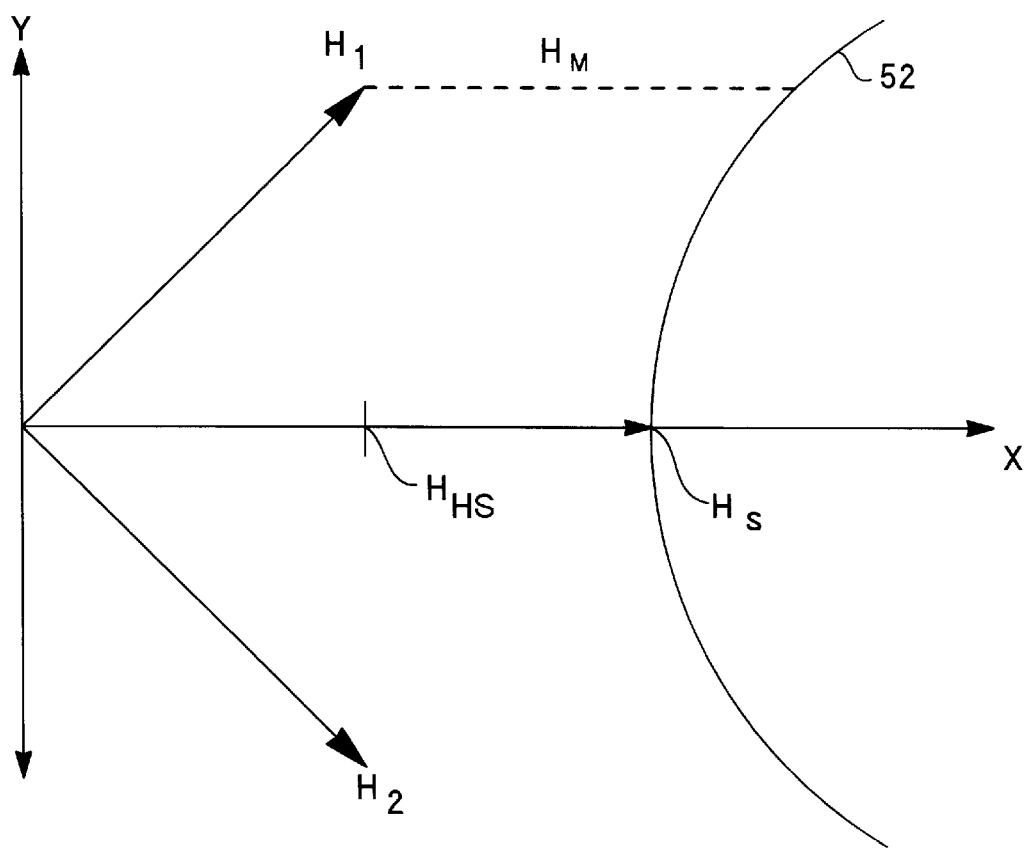
FIG. 4 illustrates the switching characteristic of a magnetic memory cell having a data layer structure which includes a control layer.

FIG. 4 shows a line 52 which illustrates the general switching characteristic of the magnetic memory cell 40 with its data layer structure 74. The presence of the control layer 60 increases the magnitude of a longitudinal magnetic field needed to switch the data layer structure 74 in the presence of a perpendicular magnetic field. For example, the $H_1$ field applied to the magnetic memory cell 40 has a longitudinal component of $H_{HS}$ whereas a magnetic field of $H_{HS}+H_M$ is needed to flip the data layer structure 74 given the perpendicular component of the $H_1$ field. $H_M$ is greater than $H_{HS}$ which therefore yields a half-select margin of greater than 100 percent.

The half-select margin $H_M$ is determined by the curvature of the line 52 away from the y axis for higher perpendicular fields. This curvature may be increased by increasing the thickness of the control layer 60 with respect to the thickness of the data layer 62. Other tunable factors include the crystalline anisotropy values of the control layer 60 and the data layer 62 and the thickness of the decoupling layer 70.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A magnetic memory comprising:
   array of magnetic memory cells each including a data storage layer having a single easy axis; and
   array of conductors each having an angle of orientation with respect to the easy axes that is preselected to enhance half-select margin in the magnetic memory.

2. The magnetic memory of claim 1, wherein an electrical current applied to each of a pair of the conductors creates a first and a second magnetic field in one of the magnetic memory cells that intersects the pair of the conductors and creates either the first or the second magnetic field in the magnetic memory cells that do not intersect the pair of the conductors.

3. The magnetic memory of claim 2, wherein the angle of orientation is preselected so that a component of each of the first and second magnetic fields along the easy axes combine to rotate an orientation of magnetization in a data storage layer of the magnetic memory cell that intersects the pair of the conductors.

4. The magnetic memory of claim 2, wherein the angle of orientation is preselected so that a component of the first magnetic field along the easy axes in the magnetic memory cells that do not intersect the pair of the conductors is substantially equal to one half of a combination of the first and second magnetic fields in the magnetic memory cell that intersects the pair of the conductors.

5. The magnetic memory of claim 2, wherein the angle of orientation is preselected so that a component of the second magnetic field along the easy axes in the magnetic memory cells that do not intersect the pair of the conductors is substantially equal to one half of a combination of the first and second magnetic fields in the magnetic memory cell that intersects the pair of the conductors.

6. The magnetic memory of claim 2, wherein the angle of orientation is preselected so that a component of each of the first and second magnetic fields perpendicular to the easy axes cancel in the magnetic memory cell that intersects the pair of the conductors.

7. The magnetic memory of claim 2, wherein the angle of orientation is substantially equal to 45 degrees.

8. The magnetic memory of claim 1, wherein each magnetic memory cell further comprises:
   decoupling layer disposed on the data storage layer;
   control layer disposed on the decoupling layer such that the control layer further enhances the half-select margin in the magnetic memory.

9. The magnetic memory of claim 8, wherein the control layer increases an amount of a magnetic field needed to rotate an orientation of magnetization in the data storage layer if the magnetic field includes a component which is substantially perpendicular to the easy axis.

10. The magnetic memory of claim 8, wherein the control layer is formed with a crystalline anisotropy that is selected to enhance the half-select margin.

11. The magnetic memory of claim 8, wherein a crystalline anisotropy of the control layer is substantially less than a crystalline anisotropy of the data storage layer.

12. The magnetic memory of claim 8, wherein the control layer is formed with a thickness that is selected to enhance the half-select margin.

13. A method for improving half-select margin in a magnetic memory, comprising the steps of:
   forming an array of magnetic memory cells each including a data storage layer having a single easy axis;
   forming an array of conductors each having an angle of orientation with respect to the easy axes that is preselected to enhance half-select margin in the magnetic memory.

14. The method of claim 13, wherein the step of forming an array of conductors comprises the step of forming the array so that an electrical current applied to each of a pair of the conductors creates a first and a second magnetic field in one of the magnetic memory cells that intersects the pair of the conductors and creates either the first or the second magnetic field in the magnetic memory cells that do not intersect the pair of the conductors.

15. The method of claim 14, wherein the angle of orientation is preselected so that a component of each of the first and second magnetic fields along the easy axes combine to rotate an orientation of magnetization in a data storage layer of the magnetic memory cell that intersects the pair of the conductors.

16. The method of claim 14, wherein the angle of orientation is preselected so that a component of the first magnetic field along the easy axes in the magnetic memory cells that do not intersect the pair of the conductors is substantially equal to one half of a combination of the first and second magnetic fields in the magnetic memory cell that intersects the pair of the conductors.

17. The method of claim 14, wherein the angle of orientation is preselected so that a component of the second magnetic field along the easy axes in the magnetic memory cells that do not intersect the pair of the conductors is substantially equal to one half of a combination of the first and second magnetic fields in the magnetic memory cell that intersects the pair of the conductors.

18. The method of claim 14, wherein the angle of orientation is preselected so that a component of each of the first and second magnetic fields perpendicular to the easy axes cancel in the magnetic memory cell that intersects the pair of the conductors.

19. The method of claim 14, wherein the angle of orientation is substantially equal to 45 degrees.

20. The method of claim 13, wherein the step of forming an array of magnetic memory cells includes the steps of:

forming a decoupling layer disposed on the data storage layers;

forming a control layer disposed on the decoupling layer such that the control layer further enhances the half-select margin in the magnetic memory.

21. The method of claim 20, wherein the step of forming a control layer comprises the step of forming the control layer with a crystalline anisotropy that is selected to enhance the half-select margin.

22. The method of claim 20, wherein the step of forming a control layer comprises the step of forming the control layer with a crystalline anisotropy that is substantially less than a crystalline anisotropy of the data storage layer.

23. The method of claim 20, wherein the step of forming a control layer comprises the step of forming the control layer with a thickness that is selected to enhance the half-select margin.

\* \* \* \* \*